(12) United States Patent
Krebs et al.

(10) Patent No.: US 9,087,987 B2
(45) Date of Patent: Jul. 21, 2015

(54) PHASE-CHANGE MEMORY CELLS

(71) Applicant: INTERNATIONAL BUSINESS MACHINES CORPORATION, Armonk, NY (US)

(72) Inventors: Daniel Krebs, Zurich (CH); Abu Sebastian, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/306,599

(22) Filed: Jun. 17, 2014

(65) Prior Publication Data

US 2015/0001457 A1    Jan. 1, 2015

(30) Foreign Application Priority Data

Jun. 28, 2013  (GB) .................................. 1311670.2

(51) Int. Cl.
*H01L 45/00* (2006.01)
*G11C 13/00* (2006.01)
*G11C 11/56* (2006.01)

(52) U.S. Cl.
CPC ........ *H01L 45/1293* (2013.01); *G11C 11/5678* (2013.01); *G11C 13/0004* (2013.01); *G11C 13/004* (2013.01); *G11C 13/0069* (2013.01); *H01L 45/1233* (2013.01); *H01L 45/1253* (2013.01); *H01L 45/1683* (2013.01); *G11C 2213/15* (2013.01); *G11C 2213/18* (2013.01); *G11C 2213/52* (2013.01)

(58) Field of Classification Search
USPC .......................................................... 257/4
See application file for complete search history.

(56) References Cited

U.S. PATENT DOCUMENTS

| 8,198,619 B2 * | 6/2012 | Lee et al. ........................... 257/4 |
| 8,233,317 B2 | 7/2012 | Breitwisch et al. |
| 8,237,457 B2 | 8/2012 | Chakravarti et al. |

(Continued)

FOREIGN PATENT DOCUMENTS

EP    2034536    11/2009

OTHER PUBLICATIONS

Muller et al, Design Challenges for Prototypical and Emerging Memory Concepts Relying on Resistance Switching, Custom Integrated Circuits Conf., Sep. 19-21, 2011, pp. 1-7.

(Continued)

*Primary Examiner* — Thao P Le
(74) *Attorney, Agent, or Firm* — Vazken Alexanian (57) ABSTRACT

Phase-change memory cells for storing information in a plurality of programmable cell states. A phase-change component is located between first and second electrodes for applying a read voltage to the phase-change component to read the programmed cell state. The component includes opposed layers of phase-change material extending between the electrodes. A core component extends between the electrodes in contact with respective inner surfaces of the opposed layers. An outer component extends between the electrodes in contact with respective outer surfaces of the opposed layers. At least one of the core and outer component is formed of electrically-conductive material and is arranged to present, to a cell current produced by the read voltage, a lower-resistance current path than the amorphous phase of the phase-change material in any of said cell states. The current path has a length dependent on size of the amorphous phase in the opposed layers.

24 Claims, 7 Drawing Sheets

(56) References Cited

U.S. PATENT DOCUMENTS

| | | | |
|---|---|---|---|
| 8,363,446 B2 | 1/2013 | Czubatyj et al. | |
| 8,674,334 B2 * | 3/2014 | Liu | 257/3 |
| 2006/0054996 A1 * | 3/2006 | Dennison | 257/536 |
| 2006/0249725 A1 | 11/2006 | Lee | |
| 2009/0108247 A1 * | 4/2009 | Takaura et al. | 257/2 |
| 2009/0127536 A1 * | 5/2009 | Nirschl et al. | 257/4 |
| 2010/0163817 A1 | 7/2010 | Savransky et al. | |
| 2014/0117300 A1 * | 5/2014 | Liu | 257/2 |

OTHER PUBLICATIONS

Wu et al., Using Multi-Level Phase Change Memory to Build Data Storage: A Time-Aware System Design Perspective, IEEE Transac. on Comp., vol. 62, Is.: Oct. 10, 2013, p. 2083-95.

* cited by examiner

PHASE-CHANGE MEMORY CELLS

CROSS-REFERENCE TO RELATED APPLICATION

This application claims priority under 35 U.S.C. §119 from European Patent Application No. 1311670.2 filed Jun. 28, 2013, the entire contents of which are incorporated herein by reference.

BACKGROUND OF THE INVENTION

1. Field of the Invention

This invention relates generally to phase-change memory cells. More specifically, the present invention relates to a phase-change memory cell for storing information in a plurality of programmable cell states.

2. Description of Related Art

Phase-change memory (PCM) is a non-volatile solid-state memory technology that exploits the reversible, thermally-assisted switching of phase-change materials, in particular chalcogenide compounds such as GST (Germanium-Antimony-Tellurium), between states with different electrical resistance. The fundamental storage unit (the "cell") can be programmed into a number of different states, or levels, which exhibit different resistance characteristics. The s programmable cell-states can be used to represent different data values, permitting storage of information.

In single-level PCM devices, each cell can be set to one of s=2 states, a "SET" state and a "RESET" state, permitting storage of one bit per cell. In the RESET state, which corresponds to a wholly amorphous state of the phase-change material, the electrical resistance of the cell is very high. By heating to a temperature above its crystallization point and then cooling, the phase-change material can be transformed into a low-resistance, fully-crystalline state. This low-resistance state provides the SET state of the cell. If the cell is then heated to a high temperature, above the melting point of the phase-change material, the material reverts to the fully-amorphous RESET state on rapid cooling. In multilevel PCM devices, the cell can be set to s>2 programmable states permitting storage of more than one bit per cell. The different programmable states correspond to different relative proportions of the amorphous and crystalline phases within the volume of phase-change material. In particular, in addition to the two states used for single-level operation, multilevel cells exploit intermediate states in which the cell contains different volumes of the amorphous phase within the otherwise crystalline PCM material. Since the two material phases exhibit a large resistance contrast, varying the size of the amorphous phase within the overall cell volume produces a corresponding variation in cell resistance.

Reading and writing of data in PCM cells is achieved by applying appropriate voltages to the phase-change material via a pair of electrodes associated with each cell. In a write operation, the resulting programming signal causes Joule heating of the phase-change material to an appropriate temperature to induce the desired cell-state on cooling. Reading of PCM cells is performed using cell resistance as a metric for cell-state. An applied read voltage causes a current to flow through the cell, this read current being dependent on resistance of the cell. Measurement of the cell read current therefore provides an indication of the programmed cell state. A sufficiently low read voltage is used for this resistance metric to ensure that application of the read voltage does not disturb the programmed cell state. Cell state detection can then be performed by comparing the resistance metric with pre-defined reference levels for the s programmable cell-states.

The development of multilevel PCM faces several key challenges. One of these is that the amorphous phase of phase-change materials exhibits undesirable attributes such as low-frequency noise and drift. This drift causes resistance of the amorphous phase to increase in value over time. As a result, the read measurements for programmed cell states tend to vary with time. This complicates read out of the stored information, potentially even destroying the information if there is a large variability in the drift exhibited by different cell states so that the read measurement distributions for neighboring cell states interfere with one another. The larger the number of cell states, and so closer the initial spacing between readback resistance levels, the more susceptible cells are to this problem.

Figure 1:
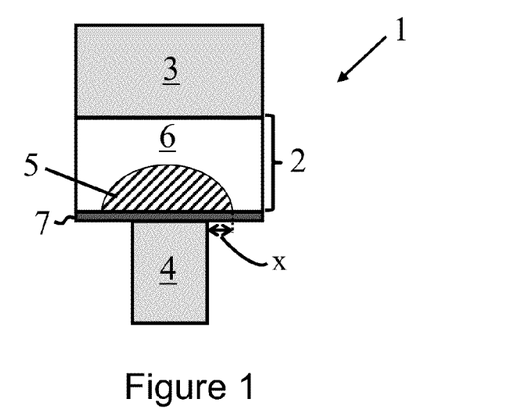
FIG. 1 shows a prior PCM cell.

Various techniques have been proposed to alleviate problems associated with resistance drift. One approach is disclosed in European Patent Application publication no. EP 2034536 A1 and illustrated in FIG. 1 of the accompanying drawings. This figure shows a schematic illustration of a PCM cell 1 having a volume of phase-change material 2 located between a top electrode 3 and a bottom electrode (or "heater") 4. The cell state shown represents an intermediate state in which the material 2 contains both crystalline and amorphous phases. The amorphous phase is indicated by the shaded hemispherical volume 5 above bottom electrode 4. The crystalline phase 6 occupies the remainder of the cell volume. A thin resistive region 7 provides a parallel current path between the bottom electrode 4 and the crystalline phase 6 of the phase-change material in operation. When a read voltage is applied to read the programmed cell-state, the resulting read current flows primarily via this current path from crystalline phase 6 to bottom electrode 4, in preference to flowing through the high-resistance amorphous phase 5. The measured cell resistance thus depends primarily on resistance of the parallel current path rather than the resistance of amorphous phase 5. The resistance of the parallel current path depends on the length "x" in the figure. This length is dependent on the size of amorphous phase 5, and thus varies with programmed cell state. Since the resistance of element 7 is unaffected by drift, the effect on the read measurement of resistance drift in amorphous phase 5 is mitigated.

Cell efficiency, which depends on the current/power required to program a PCM cell, presents another challenge. The cell efficiency can be improved by reducing the cell dimensions, but this increases the overall resistance of the cell. This makes it difficult to sense the high resistance levels associated with the multiple programmed states.

A further challenge is the occurrence of "thermal disturb". This refers to thermal cross-talk between a cell being programmed and its neighboring cell which may disturb the programmed state of the neighboring cell.

Figure 2:
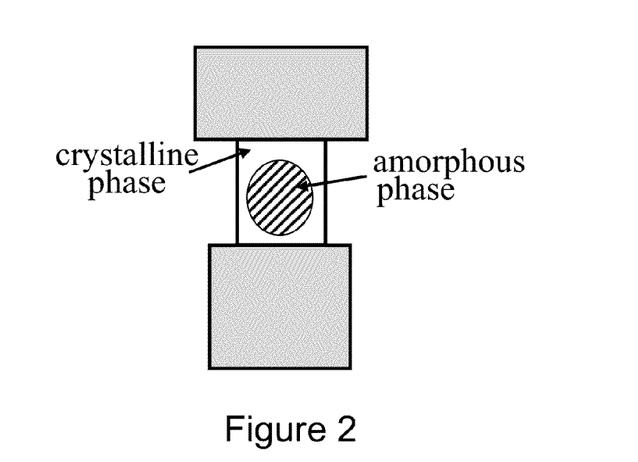
FIG. 2 shows another prior PCM cell.

Current PCM cell designs fall into two main categories: mushroom cells, also called planar cells, and confined cells. Mushroom cells, of which variants include the micro-trench cell, have the general form of the FIG. 1 cell, with a volume of PCM material having a small contact area with the underlying bottom electrode. Confined cells, of which variants include the keyhole or pore cell, have the general form shown in FIG. 2 of the accompanying drawings. Here, a smaller volume of PCM material is confined between the top and bottom electrodes. Mushroom cells are easier to fabricate than confined cells, but have serious issues with cell efficiency and thermal disturb in addition to the drift effects discussed above. Confined cells offer improved cell efficiency, but fabrication of these confined cell structures is especially challenging, particularly if filling of high-aspect ratio trenches with chalcogenides is required. One example of a fabrication method for a confined cell is described in United States Patent Application Publication US 2010/0163817A1.

Further improvements in PCM cells are desirable.

SUMMARY OF THE INVENTION

A first aspect of the present invention provides a phase-change memory cell for storing information in a plurality of programmable cell states. The memory cell includes: a phase-change component, of phase-change material, located between a first and a second electrode for applying a read voltage to the phase-change component to read the programmed cell state, the phase-change component having opposed layers of said phase-change material extending between the first and second electrodes; a core component extending between the first and second electrodes in contact with respective inner surfaces of said opposed layers; and an outer component extending between the electrodes in contact with respective outer surfaces of said opposed layers, where at least one of the core component and the outer component is formed of an electrically-conductive material and is arranged to present, to a cell current produced by the read voltage, a lower-resistance current path than an amorphous phase of said phase-change material in any of said programmed cell states, said lower-resistance current path having a length dependent on size of the amorphous phase in said opposed layers.

A second aspect of the present invention provides a method for forming a phase-change memory cell for storing information in a plurality of programmable cell states. The method includes the steps of: forming an outer component having opposed surfaces defining a trench; forming a phase-change component in the trench, the phase-change component comprising opposed layers of phase-change material in contact with respective opposed surfaces of the outer component; forming a core component in contact with respective inner surfaces of said opposed layers; and forming first and second electrodes for applying a read voltage to the phase-change component to read the programmed cell state in use, where the method is performed such that each of said outer component, said opposed layers of phase-change material and said core component extend in a direction between the electrodes, and at least one of the core component and the outer component is formed of electrically-conductive material and is arranged to present, to a cell current produced by the read voltage, a lower-resistance current path than the amorphous phase of said phase-change material in any of said cell states, said current path having a length dependent on size of the amorphous phase in said opposed layers.

A third aspect of the present invention provides a method for forming a phase-change memory cell for storing information in a plurality of programmable cell states. The method includes the steps of: forming a core component; forming a phase-change component on the core component, the phase-change component including opposed layers of phase-change material in contact with respective outer surfaces of the core component; forming an outer component in contact with respective outer surfaces of said opposed layers; and forming first and second electrodes for applying a read voltage to the phase-change component to read the programmed cell state in use, wherein the method is performed such that each of said outer component, said opposed layers of phase-change material and said core component extend between the first and second electrodes, and at least one of the core component and the outer component is formed of electrically-conductive material and is arranged to present, to a cell current produced by the read voltage, a lower-resistance current path than an amorphous phase of said phase-change material in any of said cell states, said current path having a length dependent on size of the amorphous phase in said opposed layers.

BRIEF DESCRIPTION OF THE DRAWINGS

FIG. 4a is a schematic cross-sectional view of a first PCM cell embodying the invention.

FIG. 4b is a schematic cross-section on A-A of the first PCM cell shown in FIG. 4a.

FIG. 7a is a schematic cross-sectional view of a step of a fabrication process for the cell shown in FIG. 4a.

DETAILED DESCRIPTION OF THE PREFERRED EMBODIMENTS

Preferred embodiments of the invention will now be described, by way of example, with reference to the above-mentioned drawings.

In PCM cells embodying the invention, the phase-change component has opposed layers of phase-change material extending in a direction between the electrodes. The core component is located on the inside of these opposed layers and the outer component is located on the outside of the opposed layers, each of these two components extending in a direction between the electrodes. At least one of these two components is arranged to present a lower-resistance path to the cell read current than the amorphous phase of the phase-change material. The arrangement is such that the length of this current path depends on size of the amorphous phase in the opposed layers, and thus on programmed cell state. Embodiments of the invention may offer high-performance PCM cells with reduced dimensions.

The PCM cell volume is determined by the thickness of the opposed phase-change layers, and this can be precisely controlled. The programmed volume of the cell can be shrunk compared to prior cell designs. The electrically-conductive (core and/or outer) component may ensure that the overall resistance of the PCM cell does not increase dramatically as the programmed volume is scaled down. Reduced cell dimensions and the presence of the outer component outside the opposed phase-change layers may allow better thermal insulation between two adjacent cells, mitigating thermal disturb. The cell read current will flow primarily via the lower-resistance current path through the electrically-conductive component(s) in preference to flowing through the amorphous phase. Cell resistance, and hence measured cell state, thus depends primarily on resistance of the current path through the electrically-conductive component(s), mitigating the effects of noise and resistance drift in the amorphous phase. Moreover, cells embodying the invention can be fabricated easily even with the reduced dimensions envisaged. For example, the opposed phase-change layers may be easily fabricated by a conformal layer deposition process, obviating problems associated with filling of high-aspect ratio trenches with phase-change materials. Embodiments of the invention can thus address some or all of the key challenges discussed above, providing advantageous PCM cells.

In the preferred embodiments described below, the resistance presented to the cell read current by each of the core component and the outer component is greater than that of the crystalline phase of the phase-change material in any of said cell states. In some embodiments, both the core component and the outer component are electrically-conductive. In others, only one of these components is electrically-conductive. In embodiments where this is the core component, the outer component material can be selected to provide more efficient protection against thermal disturb.

For optimal reduction of cell dimensions, the opposed layers of phase-change material are preferably substantially parallel. Moreover, in particularly preferred embodiments the opposed layers join to form an annulus around the core component. The opposed layers can thus be integrally formed during fabrication by forming a conformal layer of phase change material, for example in a cavity defined in the outer component. This provides an especially compact cell design with a very simple fabrication process. The resulting annulus preferably has a substantially circular cross-section. In general, however, the annulus can be formed with any desired cross-section.

In some embodiments, the arrangement is such that the amorphous phase in the opposed layers expands from a middle region of each of the layers towards both electrodes in successive, increasingly-resistive cell states. Other embodiments may be arranged such the amorphous phase expands in the opposed layers from one electrode towards the other in successive cell states.

For enhanced cell operation, the resistance per unit length of the or each said component formed of electrically-conductive material may vary in the direction of the aforementioned current path, thereby to provide a desired cell operating characteristic. The resistance of the current path thus varies in a non-linear manner with length of the current path, and hence with amorphous size. Varying the resistance per unit length can produce a variety of effects on cell operation, and this can be exploited to achieve a required operating characteristic.

The shape and/or resistivity of the electrically-conductive component may vary in the direction of said current path to produce the variation in resistance per unit length. In some preferred embodiments, the resistance per unit length increases in a direction in which the length of the current path increases with amorphous size. This increases the cell resistance for the higher-resistance cell states corresponding to larger amorphous size. This, in turn, increases resistance contrast and offers increased programming range, facilitating discrimination of different cell states and/or permitting storage of more levels per cell. In advantageous embodiments, the or each said component formed of electrically-conductive material comprises alternating first and second sections in the direction of said current path, the first sections being of lower resistance than the second sections, to provide a stepped programming curve for the memory cell. This provides an elegantly simple mechanism for clearly differentiating the different programmed cell states, facilitating read detection and offering fast, accurate write programming as explained in more detail below.

In preferred embodiments, the trench in the outer component is a short trench, or cavity, and the opposed layers of phase-change material join to form an annulus in the cavity.

In preferred embodiments, the method is performed such that the opposed layers of phase-change material join to form an annulus around the core component.

Except where context requires otherwise, steps of the above methods can be performed in any convenient order.

In general, where features are described herein with reference to an embodiment of one aspect of the invention, corresponding features may be provided in embodiments of another aspect of the invention.

Figure 3:
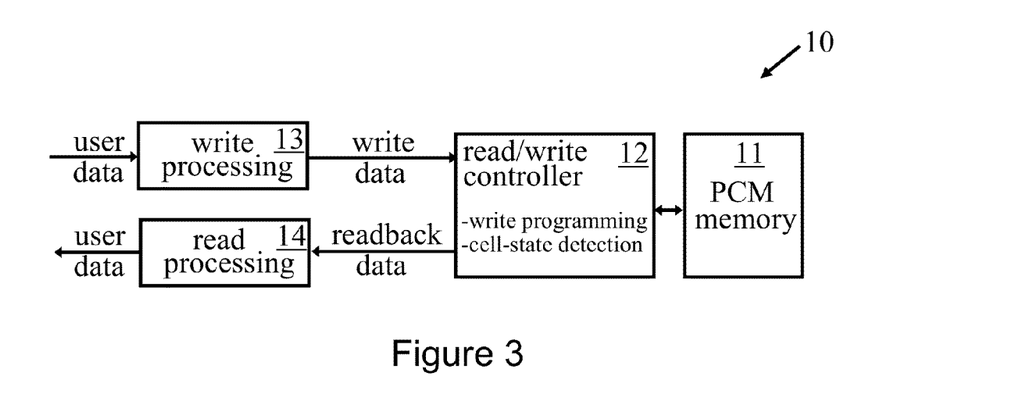
FIG. 3 is a schematic block diagram of a memory device embodying the invention.

FIG. 3 is a simplified schematic of a phase-change memory device embodying the invention. Device 10 includes multi-level phase-change memory 11 for storing data in one or more integrated arrays of PCM cells described below. Reading and writing of data to memory 11 is performed by a read/write controller, or controller, 12. Controller 12 includes circuitry of generally known form for programming PCM cells during data write operations and making read measurements for detecting cell-state during data read operations. During these operations, the read/write controller can address individual PCM cells by applying appropriate control signals to an array of word and bit lines in memory ensemble 11. As indicated by block 13 in FIG. 3, user data input to device 10 is typically subjected to some form of write-processing, such as coding for error-correction purposes, before being supplied as write data to controller 12. Similarly, readback data output by controller 12 is generally processed by a read-processing module 14, e.g., for codeword detection and/or error correction, to recover the original input user data.

The PCM cells of memory 11 can store information in s>2 programmable cell states, providing multilevel operation. As discussed earlier, the s programmable cell-states correspond to different relative proportions of the amorphous and crystalline phases within the PCM material of the cell. These states include a high-resistance, fully-amorphous RESET state, a low-resistance, fully-crystalline SET state, and a number of intermediate states corresponding to increasing size of the amorphous phase within the otherwise crystalline PCM material. The s programmable cell-states are typically defined in controller 12 in terms of predetermined reference values, or ranges of values, of the resistance metric used for read detection. To program a cell in a write operation, controller 12 applies a voltage to the cell via the word- and bit-lines such that the resulting programming signal sets the cell to the required state. In a read operation, a (lower) read voltage is applied to the cell and the resulting cell current is measured to obtain the resistance metric. Controller 12 can then detect the programmed cell state by comparing the read metric with the aforementioned reference values.

Figures 4A, 4B:
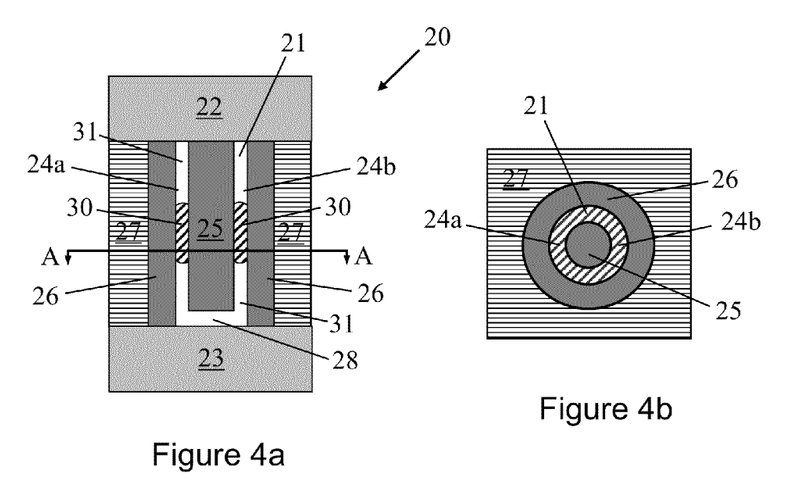

FIG. 4a is a schematic cross-sectional view of a first PCM cell embodying the invention. Cell 20 has phase-change component 21, formed of phase-change material, located between first and second electrodes 22, 23 for connecting the cell to the word and bit lines respectively of the cell array. (Such electrodes may be referred to herein as a "top" electrode and a "bottom" electrode, according to their arrangement in the Figures, though no limitation is implied as to cell orientation in operation). Phase-change component 21 includes opposed layers 24a, 24b, seen in cross-section in the figure, of the PCM material. These opposed PCM layers 24a, 24b extend in a direction between electrodes 22 and 23 and are substantially parallel with one another in this embodiment. The cell includes core component 25 which extends in a direction between the electrodes in contact with the inner, facing surfaces of opposed PCM layers 24a, 24b. The cell also has outer component 26 which extends in a direction between the electrodes in contact with the outer (outwardly-facing) surfaces of opposed layers 24a, 24b. The inner and outer components 25, 26 are both formed of electrically-conductive material in this embodiment. Cell 20 also has a surrounding insulating layer 27.

FIG. 4b is a schematic cross-section on A-A in FIG. 4a. As can be seen in this figure, opposed layers 24a, 24b of phase-change component 21 are integrally-formed in this embodiment, joining to form an annulus around core component 25. The annulus has a substantially circular cross-section in this example, whereby opposed layers 24a, 24b constitute respective sides of a substantially cylindrical annulus of phase-change material. Core component 25 and outer component 26 have circular cross-sections conforming to PCM annulus 21. Referring again to FIG. 4a, phase-change component 21 also has base layer 28, located between bottom electrode 23 and the proximal end of core component 25, joining opposed side layers 24a, 24b. The cylindrical annulus of phase-change component 21 is thus closed at one end by base layer 28. (The term "base" is used herein without implied limitation as to cell orientation). Core component 25 thus forms an elongate core of electrically-conductive material extending over the majority of the distance between electrodes 22, 23 inside PCM annulus 21. Outer component 26 is formed here by a layer of electrically-conductive material which extends from one electrode to the other on the outside of PCM annulus 21.

Opposed layers 24a, 24b of phase-change component 21 are shown in FIG. 4a containing an amorphous phase, indicated by regions 30, and a crystalline phase, indicated by regions 31. The relative proportions of these phases differ for the different programmable cell states as described earlier. Hence, the s programmable states of cell 20 correspond to different sizes of amorphous phase 30 in opposed layers 24a, 24b. In this embodiment, amorphous phase 30 forms in a middle region of each of the opposed layers, spaced from electrodes 22, 23, and expands outwardly towards both electrodes in successive, increasingly-resistive cell states.

Opposed PCM layers 24a, 24b can have a thickness in the range of about 1 to 20 nm, and preferably about 1 to 10 nm. The electrically-conductive core component 25 can have a thickness (here diameter) in the range of about 1 to 20 nm, and preferably about 1 to 10 nm. The electrically-conductive layer forming outer component 26 can have a thickness in the range of about 1 to 10 nm, and preferably about 1 to 5 nm. As an illustrative example, in this particular embodiment the opposed layers 24a, 24b and base 28 of PCM component 21 have a thickness of about 2 nm.

PCM component 21 has a length of about 35 nm from top electrode 22 to bottom electrode 23. The core component 25 has a diameter of about 4 nm and the outer component 26 has a thickness of about 2 nm. In an exemplary implementation, the PCM component 21 can include GST, electrodes 22, 23 can be formed of TiN, and the core and outer components 25, 26 can be formed of TaN. Insulating layer 27 can be formed of silicon dioxide or silicon nitride. In general, however, the materials and dimensions of PCM component 21 and the electrically-conductive components 25, 26 are selected to satisfy particular requirements.

In particular, each electrically-conductive component 25, 26 presents a lower-resistance current path, to a cell current produced by the read voltage for cells, than the amorphous phase 30 of the phase-change material in any of the s programmed cell states defined for multilevel operation. This lower-resistance current path has a length dependent on size of the amorphous phase in the opposed layers. In this preferred embodiment, the resistance presented to the cell read current by each electrically-conductive component 25, 26 is less than that of amorphous phase 30, and greater than that of crystalline phase 31, of phase-change material 21 in any of the s programmed cell states. The effect of these features will now be explained with reference to FIGS. 5 and 6.

Figure 5:
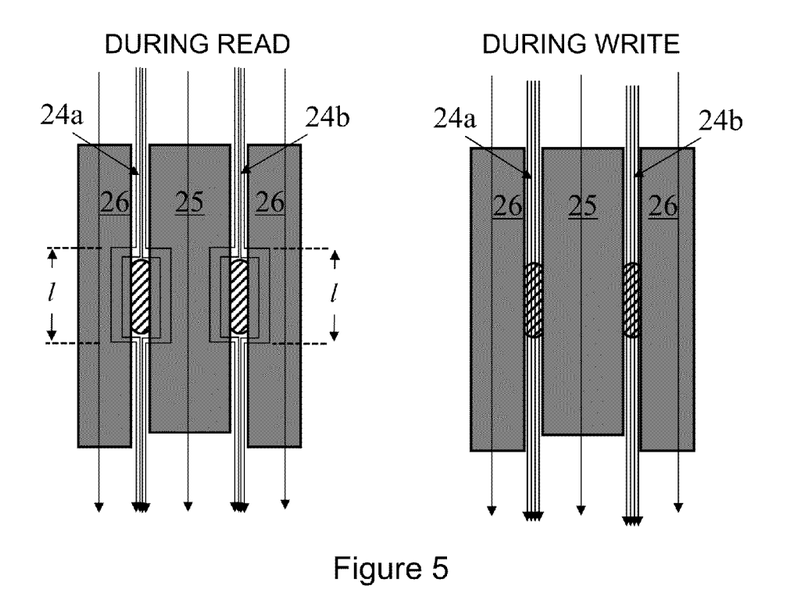
FIG. 5 indicates current flow in the FIG. 4a cell during read and write operations.
Figure 6:
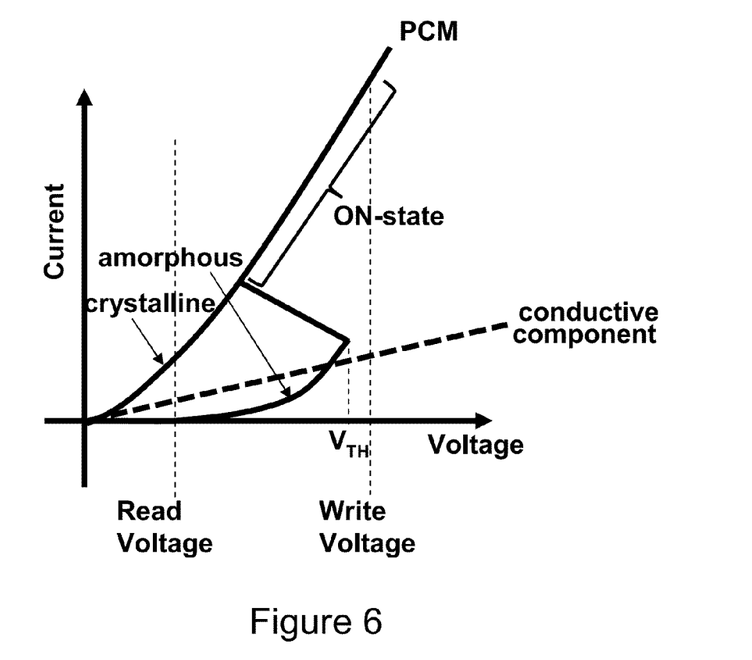
FIG. 6 indicates resistive properties of elements of the FIG. 4a cell.

FIG. 5 indicates current flow in cell 20 during read and write operations, where current density is indicated schematically by spacing of the vertical arrows. Due to the resistance properties described above, in a read operation as indicated on the left of the figure, the cell current flows primarily through crystalline phase 31 of the PCM material in preference to electrically-conductive components 25 and 26, and primarily through electrically-conductive components 25, 26 in preference to amorphous phase 30 of the PCM material. The resulting current path through conductive components 25, 26 has a length/which is directly dependent on size of the amorphous phase 30 in the PCM layers 24a, 24b, increasing as the amorphous volume expands in these layers.

In a write operation, however, where a significantly higher voltage is applied between the cell electrodes, the cell current flows primarily through PCM layers 24a, 24b as indicated on the right of the figure. The resistive properties which provide these effects can be understood from a consideration of FIG. 6. This is a schematic illustration of the current/voltage (and hence resistance) characteristics of the material components of cell 20. The solid lines indicate variation of current with voltage for the PCM material of component 21, starting from the fully-crystalline SET state (upper curve) and also the fully-amorphous RESET state (lower curve). These two curves reflect the large (typically 3 orders of magnitude) variation in resistivity between the crystalline and amorphous phases. The broken line in the plot indicates the (here ohmic) characteristic for the electrically-conductive core and outer components 25, 26.

It can be seen that, at low voltages including the cell read voltage, the resistance of components 25, 26 is between that of the amorphous and crystalline phases of PCM component 21. The resulting current flow during a read operation is thus as indicated in FIG. 5. The amorphous phase exhibits a non-linear characteristic with a threshold switching phenomenon that is field induced. At a certain threshold voltage $V_{TH}$, this phase switches to a very low "ON-state" resistance corresponding to that of the crystalline PCM material. The cell programming (write) voltage is selected to be above this threshold voltage as indicated. At this voltage, the ON-resistance of PCM component 21 is much less than that of the core and outer components 25, 26. The write-current is thus substantially unaffected by presence of the electrically-conductive components 25, 26 as indicated in FIG. 5.

Based on the above principles, preferred cell arrangements are such that, at the cell read voltage, the resistance $R_{ec}$ of an electrically-conductive component 25, 26 is far from both the resistance $R_{amo}$ of the fully-amorphous (RESET) state, and also the resistance $R_{cry}$ of the fully-crystalline SET state, of the PCM material (where "far" here means far within the context of the resistance range from $R_{cry}$ to $R_{amo}$). In general, an appropriate value for $R_{ec}$ in this range will depend on various factors such as the materials and dimensions of cell components, the particular characteristics of the s programmable cell states, the operating parameters (e.g. read and write voltages) of memory device 1 as well as desired performance criteria such as maximum acceptable error-rate. In general, however, the arrangement is preferably such that $R_{ec} \gg R_{cry}$ and $R_{ec} \ll R_{amo}$ within the context of the aforementioned range.

Due to the resistance characteristics described above, the effect of resistance drift in the amorphous phase on cell read operations is significantly reduced. This is because the cell current flows mainly through crystalline phase 31 and the electrically-conductive material of components 25, 26, and these materials do not exhibit drift. In preferred embodiments, both of the core and outer components extend substantially from one electrode to the other. In the particular example of FIG. 4a, PCM base layer 28 is sufficiently thin that core 25 extends almost fully between the electrodes, and outer component 26 contacts both electrodes. The resulting full parallel current path between the electrodes provides drift-resistant operation regardless of amorphous size. Moreover, any residual drift effect (due to the very small current flowing through amorphous phase 30) will exhibit low variability between different cell states since the resistance properties described above ensure that current through electrically-conductive components 25, 26 will always dominate.

In effect, the programmed state of cell 20 can be considered to be projected onto the resistance of the conductive material of components 25, 26 in a read operation, as the length/of the current path through the sheath reflects the amorphous size and hence the programmed state. The resistance information is thus effectively stored in conductive components 25, 26 and resistance of the PCM material is no longer used to differentiate cell states. In effect, therefore, the arrangement provides full decoupling of the phase-change operation and the information storage/readout task.

The design of cell 20 also allows the programming volume of PCM material to be dramatically reduced without compromising overall resistance of the PCM cell. The PCM cell volume is defined by the thickness of PCM layers 24a, 24b which can be precisely controlled. Due to the presence of conductive components 25, 26, the overall resistance of the PCM cell does not increase significantly when the programmed volume is scaled down. In general, the volume of phase change material can be arbitrarily small, while the phase change resistance can be made arbitrarily large. In particular, the PCM volume can be reduced, and the resistivity of the phase change material increased, to achieve a very low RESET current and a consequent reduction in power consumption.

Noise associated with resistance of the phase-change material can also be heavily masked by the electrically-conductive components. The cell design also mitigates the effects of thermal disturb between neighboring cells in memory arrays. Outer component 26 provides a thermal barrier and heat sync, and the presence of this component coupled with reduced cell dimensions allows adequate distance to be maintained between PCM elements even with much smaller cell-spacing. This provides better thermal insulation between two adjacent cells. Moreover, it is a major advantage of the above cell design is that it is very easy to fabricate, even with the reduced dimensions envisaged for these cells. Basic steps of one exemplary fabrication process for cell 20 are described below.

Figure 7A:
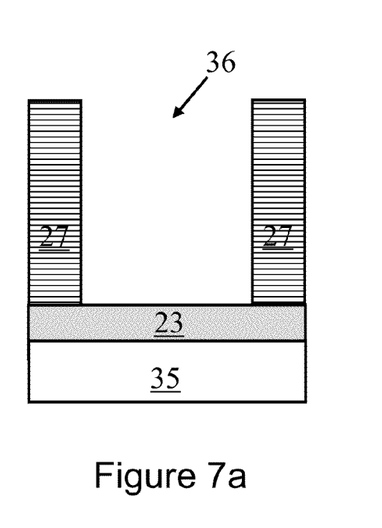

FIGS. 7a to 7e are schematic cross-sectional views through the cell structure in successive stages of the fabrication process. Using standard deposition and lithography techniques, TiN bottom electrode 23 is first formed on an insulating substrate 35. A layer of silicon dioxide 27 is subsequently deposited on electrode 23 and trench 36 is etched in this layer as shown in FIG. 7a. For this particular cell design, trench 36 has the form of a cavity which is substantially cylindrical (within tolerances inherent in the fabrication process).

Figure 7B:
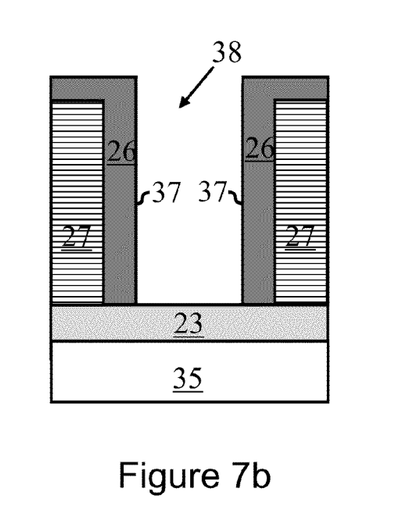
FIG. 7b shows a deposition step of a fabrication process for a PCM cell embodying the present invention.
Figure 7C:
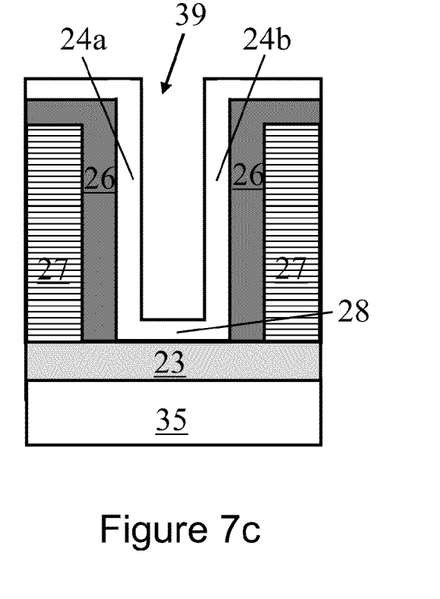
FIG. 7c is a schematic cross-sectional view of a step of a fabrication process for a PCM cell.
Figure 7D:
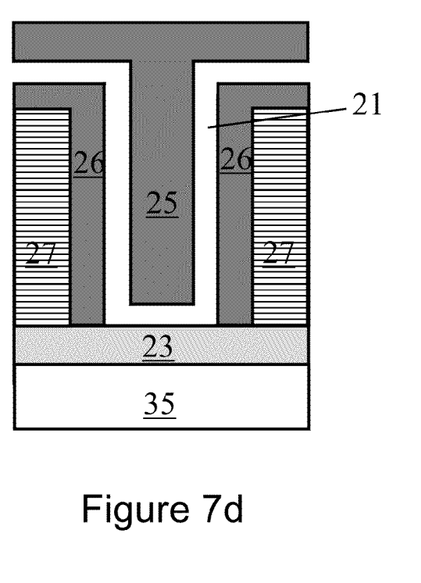
FIG. 7d is a schematic cross-sectional view of a deposition step of a fabrication process for a PCM cell.

Next, as shown in FIG. 7b, a layer of TaN is deposited as a conformal layer in cavity 36. The base portion of this TaN layer is removed to form outer component 26. This component has opposed surfaces 37 which again define a trench in the form of a substantially cylindrical cavity 38. Next, a layer of GST is deposited as a conformal layer in cavity 38 such that the opposed layers 24a, 24b are formed in contact with the opposed surfaces 37 of outer component 26, and base layer 28 contacts bottom electrode 23. The resulting GST layer then defines a further substantially cylindrical cavity 39 as shown in FIG. 7c. Next, as illustrated in FIG. 7d, a further TaN deposition step is performed to form the core component 25 in cavity 39 in contact with respective inner surfaces of opposed GST layers 24a, 24b. Finally in this embodiment, the remaining layer structure above the top of silicon dioxide layer 27 is removed, by etching and/or polishing steps, and the top electrode 22 is formed by deposition and patterning of a further TiN layer.

The various cell components are easily fabricated by the simple process above in spite of the small cell dimensions. Problems associated with filling of high-aspect ratio trenches with phase-change materials are obviated. The low-volume phase-change component 21 is easily formed by a conformal layer deposition process, allowing precise control of the layer thickness and so PCM volume. Thus, trenches need not be completely filled with phase-change material and there is no need to compromise on material composition or risk problems associated with formation of voids.

Figure 7E:
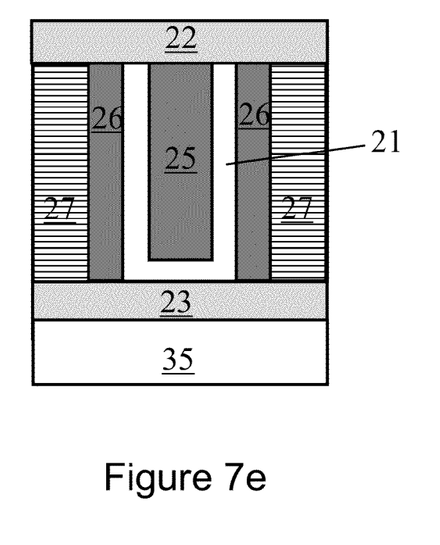
FIG. 7e is a schematic cross-sectional view of an omission step of a fabrication process for a PCM cell.

Various modifications can be made to the above cell design and fabrication process. For example, embodiments can be envisaged in which the fabrication process is simplified by omitting step 7e described above. That is, the PCM cell could have the structure illustrated in FIG. 7d. In this case, the overlying TaN layer could provide the top electrode for the cell, or the top electrode could be formed as an additional layer on the TaN layer. The PCM layer which then remains interposed between the top of outer component 26 and the overlying TaN layer may have little material effect in operation of such structures, particularly due to the low thickness envisaged for the PCM layer.

An alternative fabrication process may build the cell structure from the core out. That is, the core component would be formed first on top of one electrode on a substrate. The core component may, for example, comprise a nanowire (including a nanotube or nanoribbon). The phase-change component would then be formed on the core component, with the opposed layers of phase-change material in contact with respective outer surfaces of the core component. These may again join to form an annulus around the core component. The outer component could then be formed in contact with respective outer surfaces of the opposed PCM layers. A surrounding layer of insulating material, and the second electrode, can then be formed on this structure.

Figure 8:
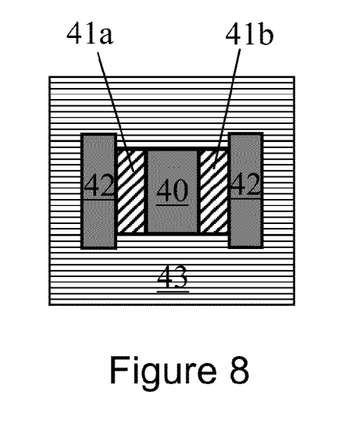
FIG. 8 illustrates a modified form of a PCM cell embodying the invention.

While the cell components have a generally circular cross-section in the above embodiment, these components can have any convenient cross-sectional shape. Moreover, while opposed PCM layers 24a, 24b join laterally to define an annulus above, these layers may not be integrally formed in some embodiments. FIG. 8 is a schematic cross-sectional view, similar to FIG. 4b, of an exemplary cell structure illustrating this modification. (The perpendicular cross-section of this cell structure is generally similar to that of FIG. 4a, and only the key differences are described here).

The cell has core component 40, of rectangular cross-section, in contact with respective inner surfaces of opposed PCM layers 41a, 41b. These layers are provided only on opposite sides of core 40 and do not join together to form an annulus around the core. Outer component 42 is provided on both sides of the structure in contact with respective outer surfaces of opposed layers 41a, 41b. The cell structure is surrounded by insulating material 43. Such a cell structure can be achieved, for instance, via a process similar to that illustrated in FIGS. 7a to 7e but in which the TaN and PCM layers are deposited in a localized region of an elongate trench (extending into the page in FIG. 7a) in insulating material 27. Other fabrication processes can of course be envisaged, including modifications as described earlier.

Figure 9:
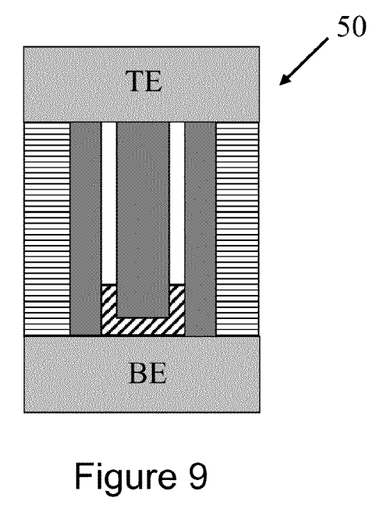
FIG. 9 shows a further embodiment of a PCM cell.

A modified form of the above cell design is illustrated in FIG. 9. Cell 50 corresponds generally to that of FIG. 4a, but the arrangement is such that amorphous phase 30 expands in the opposed PCM layers from the bottom electrode (BE) towards the top electrode (TE). That is, the amorphous phase 30 forms initially above the bottom electrode and increases in size towards the top electrode for successively higher-resistance cell states. The thermal system of cell 50 is thus designed so that the "hot-spot" is located just above the bottom electrode. This can be achieved by appropriate thermal engineering of the cell, e.g., by selecting suitable parameters such as the relative size, arrangement, thickness, and thermal conductivity of the electrodes, as will be readily apparent to those skilled in the art. Although the core component does not contact (and therefore provide a direct current path to) the bottom electrode here, the intervening PCM base layer may be sufficiently thin that it does not significantly affect operation in this regard. Operation of the outer conductive component is unaffected by this modification.

Figure 10:
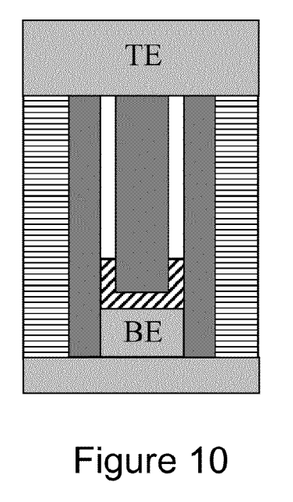
FIG. 10 shows another embodiment of a PCM cell of the present invention.

FIG. 10 illustrates a further possible modification to the FIG. 9 cell. Here, the bottom electrode is confined within the outer component to the lateral dimensions of the PCM base layer. This arrangement can facilitate formation of the hot-spot above the bottom electrode due to its reduced size and thus localized heating effect. Fabrication can also be simplified as the outer component can be formed directly on the substrate and used for patterning of both the bottom electrode and formation of the PCM component.

Figure 11:
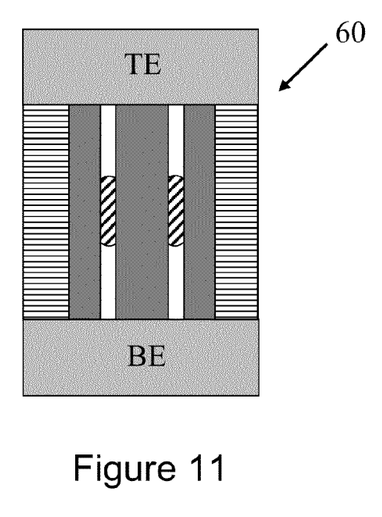
FIG. 11 shows an embodiment of a PCM cell of the present invention.

Another modified cell design is illustrated in FIG. 11. Cell 60 again corresponds generally to that of FIG. 4a, but PCM base layer 28 has been removed, e.g. by etching, between FIGS. 7c and 7d of the fabrication process. Here, therefore, the core component extends from one electrode to the other providing a full parallel current path between the electrodes. This may be preferred in some embodiments (e.g. with the amorphous/crystalline configuration of FIG. 9) to avoid any possible effect of the PCM base layer on cell operation. However, simulations indicate that presence of this layer may have no significant effect, particularly on preferred cell structures with the amorphous/crystalline configuration of FIG. 4a, whereby fabrication can be simplified by omitting the removal of this layer.

In other variants of the above cell designs, only one of the core component and outer component can be formed of electrically-conductive material, the other component being an insulator. In cells corresponding generally to FIGS. 4a and 11, for example, the core component can be formed of electrically-conductive material, and the outer component may be an insulator selected to provide enhanced electrical and thermal insulation for the cell. In other embodiments, however, only the outer component may be electrically-conductive. Whichever component is conductive, resistance requirements discussed earlier apply to this component to provide a current path for the read current having a length which varies with amorphous size. If the core or outer component is non-conductive, then this component can be selected to have any convenient thickness.

At least where only one of the core and outer components is conductive, it is preferred that the volume of the electrically-conductive material is greater than about half the volume of phase-change material, and preferably equal to, or greater than, the volume of the phase-change material. Most preferably the volume of the electrically-conductive material is greater than the volume of phase-change material. For example, the thickness of the electrically-conductive component perpendicular to the direction between the electrodes may be greater than about half that of the opposed phase-change layers. Preferably this thickness is approximately equal to, or greater than, (and is most preferably greater than) the thickness of the opposed phase-change layers. (Note that, in general, the aforementioned thickness need not be constant over the extent of the electrically-conductive component between the electrodes. However, the thickness conditions may still apply substantially at any point over this extent.)

Figure 12:
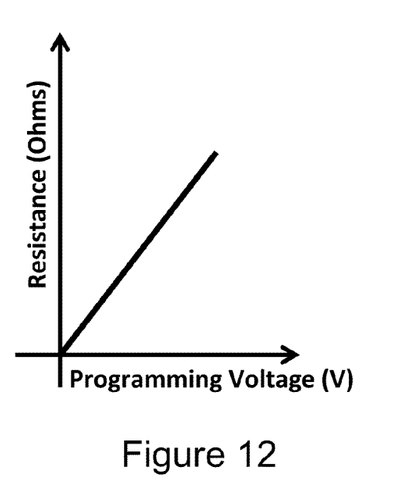
FIG. 12 shows a programming curve for a PCM cell embodying the invention.
Figure 13:
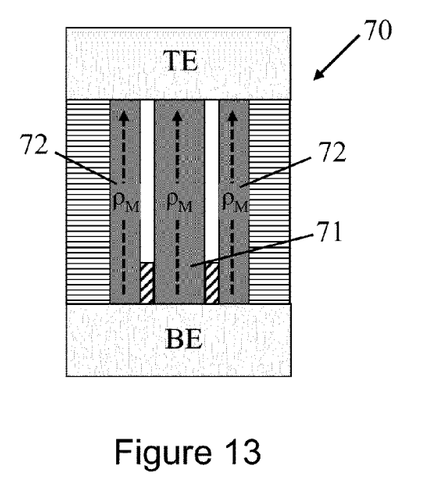
FIG. 13 shows another form of PCM cell embodying the invention.

FIG. 12 indicates variation of cell resistance with programming voltage for the above cell designs assuming that the electrically-conductive material of the core and/or outer component is of uniform resistivity. As amorphous size increases with increasing programming voltage, the resulting cell resistance increases accordingly, giving the linear programming curve shown. In other PCM cells embodying the invention, however, the resistance per unit length of the (or each) electrically-conductive component is not uniform, but varies along the direction of the aforementioned current path so as to provide a desired cell operating characteristic. A first such PCM cell is illustrated in FIG. 13.

Cell 70 corresponds broadly to the FIG. 11 cell but has the amorphous configuration of the FIG. 9 cell. The resistive properties of the various components of this cell 70 conform to the basic requirements discussed above. However, the resistivity $\rho_M$ of the material forming the core component 71 and outer component 72 varies in a direction between the electrodes, increasing generally monotonically from the bottom electrode towards the top electrode as indicated by the arrows in the figure. As a result, the resistance per unit length of these components varies in the direction of the aforementioned current path (as indicated in FIG. 5) through the electrically-conductive material. Specifically, the resistance per unit length increases in the direction of increasing length of the current path corresponding to increasing amorphous size.

Figure 14:
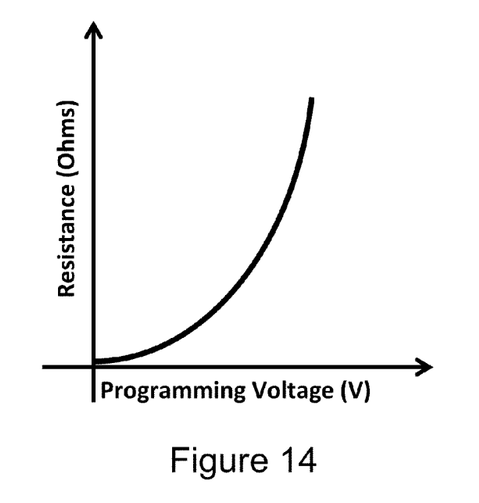
FIG. 14 shows a programming curve for the FIG. 14 cell.

The effect of this variation in resistance per unit length is to modify the programming curve as indicated in FIG. 14. Compared to the linear relation of FIG. 12, a higher-resistance state is achieved for a given programming voltage, the resistance difference increasing with increasing programming voltage. In effect, therefore, the cell resistance for the higher programmed cell states is increased, enhancing the overall resistance contrast and providing increased programming range. This effectively increases the programming space available for resistance levels corresponding to different cell states, facilitating discrimination of different cell states on readback and/or permitting storage of more levels per cell.

The particular values and variation of the resistivity $\rho_M$ can be selected as required in a given cell structure to achieve a desired operational characteristic, e.g. a desired programming range, and/or desired resistance values for particular programmed cell states, and/or a programming curve of a desired shape. Appropriate values and ranges will depend on various factors such as the particular materials and dimensions of elements of the cell structure, desired characteristics of the s programmable cell states, the operating parameters (e.g. read and write voltages) of memory device 1 as well as desired performance criteria such as maximum acceptable error-rate. Appropriate parameters in a given scenario will be readily apparent to those skilled in the art. In some embodiments, the resistivity $\rho_M$ of the electrically-conductive material might vary from a value close to that of the amorphous phase at the bottom electrode to a value close to that of the crystalline phase at the top electrode (subject to the general resistance requirements described earlier). The term "close" here means close within the context of the range (typically spanning several orders of magnitude) from the resistivity $\rho_C$ of the crystalline PCM material to the resistivity $\rho_A$ of the amorphous PCM material.

PCM cell 70 can be fabricated using standard processing techniques to form the various cell elements. For example, outer TaN component 72 can be deposited, perpendicularly to the surface of the bottom electrode, in a region defined between the outer insulating material and an inner former which is subsequently removed. During the deposition process, the resistivity of the TaN layer can be gradually increased, for example, by increasing the flow rate of nitrogen gas over the structure. After removal of the former, the PCM layer can be deposited as before. The core component can then be deposited perpendicularly again, increasing the nitrogen flow rate as before. In other embodiments, the conductive component(s) could be formed of a doped semiconductor material, e.g. doped silicon, and the resistivity variation could be achieved by varying the doping level during deposition.

In alternative embodiments, only one of the core and outer components may be electrically-conductive to simplify the fabrication of such a "modulated-resistance" cell. In any case, the increase in resistivity with length could be substantially continuous, or could be graduated in some embodiments. Similar principles might also be employed in cells where the amorphous phase increases in size from a middle region of the opposed PCM layers. In such cases, the resistance per unit length of the conductive component(s) could increase in two directions, i.e. from a middle region towards both the top and bottom electrodes, corresponding to expansion of the amorphous volume.

Figure 15:
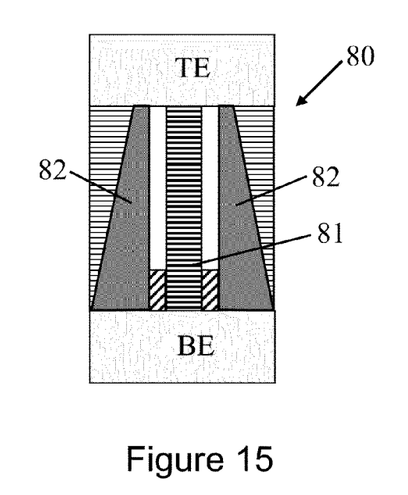
FIG. 15 shows another PCM cell embodying the invention.

FIG. 15 is a schematic cross-sectional view of another PCM cell embodying the invention. Cell 80 is adapted to operate generally as cell 70 above and only the key differences are discussed in the following. In cell 80, core component 81 is formed of insulating material and outer component 82 is formed of electrically-conductive material. The thickness of outer component 82 decreases in a direction from the bottom electrode to the top electrode. Resistivity $\rho_M$ of outer component 82 is substantially uniform in this example. However, the decreasing component thickness causes the resistance per unit length of this component to increase with increasing length of the current path as described above. Thus, the shape variation results in similar modification of the programming curve as the resistivity variation in cell 70. As before, the particular geometric and material parameters in this embodiment can be selected to provide a desired cell characteristic.

Other component shapes and shape-variations can of course be envisaged, e.g. a step-wise variation, or a bi-directional variation for a centrally-disposed hot-spot, and a combination of shape and resistivity modulation can be employed if desired. The required shape of the electrically-conductive component can be produced in any convenient manner, for example by using appropriately shaped spacers, or formers, during deposition.

Figure 16:
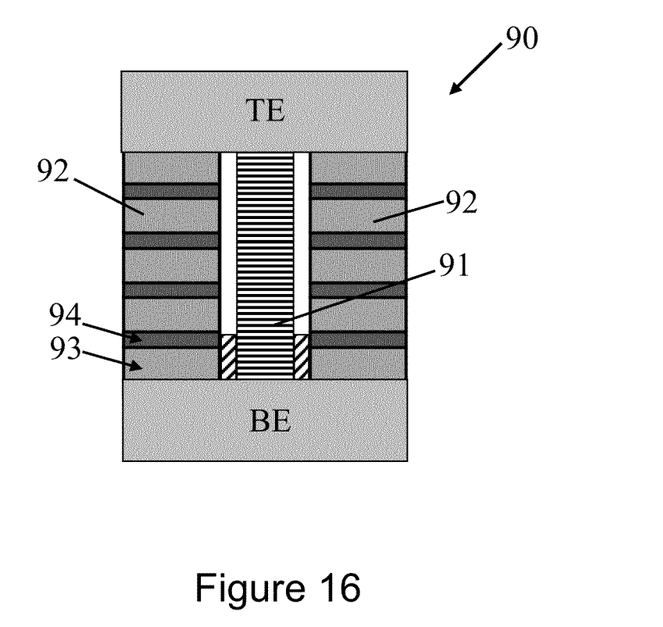
FIG. 16 shows a further PCM cell embodying the invention.

FIG. 16 is a schematic cross-sectional view of another PCM cell embodying the invention. Cell 90 again conforms to the general operating principles discussed above, and only the key differences will be described below. Core component 91 is formed of insulating material and outer component 92 is formed of electrically-conductive material. In this design, however, outer component 92 includes alternating first and second sections, 93 and 94 respectively, in the direction of the current path though this component. First sections 93 are of lower resistance than second sections 94. In this preferred embodiment, second sections 94 are of smaller thickness than first sections 93. First sections 93 also have a lower resistivity $\rho_{M1}$ than resistivity $\rho_{M2}$ of second sections 94.

Figure 17:
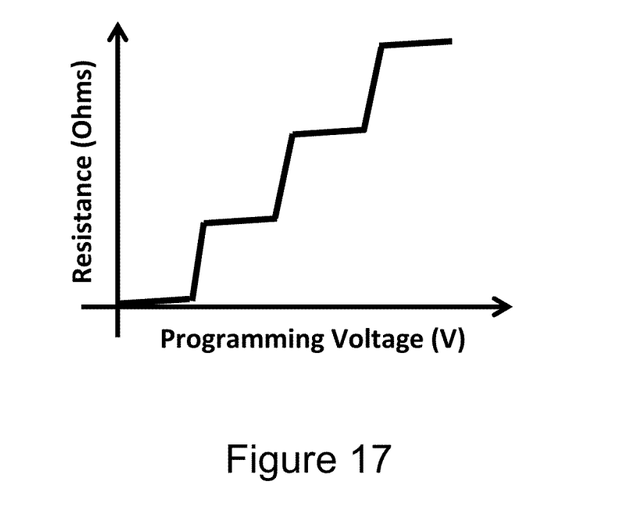
FIG. 17 shows a programming curve for the FIG. 16 cell.

FIG. 17 indicates the effect on the programming curve of this modulation in the resistance per unit length of component 92. The curve has a stepped shape, with the steeper sections corresponding to respective higher-resistance layers 94 and the flatter sections corresponding to the lower-resistance layers 93. This type of stepped programming curve provides an excellent mechanism for defining, and differentiating, multiple cell levels corresponding to different programmable states. The steps can be adapted such that each step, and specifically the flat, top section of the step, corresponds to a respective programmable cell state.

The measured cell resistance varies little over the range of programming voltages corresponding to this section, giving well-defined resistance levels for each cell state. In addition, the resistance levels corresponding to different cell states are well separated due to the steep side-sections of the steps. This cell design thus provides an elegantly simple mechanism for clearly differentiating different programmed cell states. This both facilitates read detection and offers fast, accurate write programming. In particular, such multilevel cells are especially amenable to so-called "single-shot programming", whereby a required cell-state is achieved using a single programming pulse. This contrasts with the more-common, iterative programming technique which uses a series of programming pulses, with intervening read operations, to gradually converge on the required state.

Subject to the general resistance requirements described earlier, first sections 93 preferably have a resistivity close to resistivity $\rho_C$ of the crystalline phase of the PCM material, and second sections 94 preferably have a resistivity close to resistivity $\rho_A$ of the amorphous PCM material, in order to enhance the stepped structure of the programming curve. (Again, the term "close" here should be construed in the context of the large resistivity range from $\rho_C$ to $\rho_A$). If second sections 94 are of sufficiently small thickness, the resistivity of these sections can be sufficiently close as to be approximately equal to $\rho_A$.

Cell 90 can be fabricated generally as described earlier, varying the resistivity of component 92 layer-by-layer during deposition, and the various materials, dimensions and other parameters can be selected as required to give a desired shape to the programming curve. Various modifications to this design can also be envisaged. For example, the layer structure, and resulting steps of the programming curve, may not be entirely regular but can be adapted to particular requirements for different programming states. A similar resistivity modulation might also be achieved by modulating the thickness of the outer component, or via a combination of shape and resistivity variation. In other embodiments, the resistance-modulated layer structure can be applied to core component 91 instead of outer component 92.

Numerous further modifications to the above embodiments can be envisaged. For example, use of the same material for electrically-conductive core and outer components is convenient but is not essential. Also, while substantially parallel opposed layers of phase-change material are preferred (within tolerances inherent in the fabrication processes) to provide a particularly compact design, embodiments might be envisaged where the opposed side layers, while not parallel, each extend in a direction generally from one electrode towards the other. While examples of fabrication processes are described above, in general the various elements of PCM cells embodying the invention can be formed in any desired manner, and in any convenient order, to give the required arrangement. Suitable processes and techniques will be readily apparent to those skilled in the art. Also, modifications described for one embodiment may be applied to another embodiment as appropriate.

While particular examples have been given for illustrative purposes above, any materials and dimensions giving the required properties and resistance characteristics may be selected for the various elements of PCM cells embodying the invention. Alternative phase change materials include other compounds of some or all elements Ge, Sb and Te, such as $Ge_2Sb_2Te_5$, GeTe, and $Ge_{15}Sb_{85}$ for example. Such compounds may also have added constituents such as carbon, nitrogen, silicon, or silicon dioxide for instance. Other possible materials include In—Ge—Te alloys, Si—Sb—Te alloys and Si—Sb alloys.

In general, the electrically-conductive component(s) can be formed of any suitable material. Examples of such materials include metal nitrides such as TiN, TiAlN, TaN, BN, metal oxide nitrides such as TiON, metal silicides such as PtSi, semiconductors such as silicon or germanium (with and without doping), reduced metal oxides such as TiOx ($x<2$ indicates reduction), metals such as W, Ni, Co, or carbon based materials. The electrodes can be formed of any convenient electrically-conductive material, typically a metallic material (e.g. a pure metal or a metal compound, alloy or other mixture) or a doped semiconductor material such as silicon. Moreover, while the features described are particularly advantageous for multi-level cells, these features can also be applied to advantage in single-level cells in some embodiments.

It will be appreciated that many further changes and modifications can be made to the exemplary embodiments described without departing from the scope of the invention.

We claim:

1. A phase-change memory cell for storing information in a plurality of programmable cell states, the memory cell comprising:
   a phase-change component, of phase-change material, located between a first and a second electrode for applying a read voltage to the phase-change component to read the programmed cell state, the phase-change component having opposed layers of said phase-change material extending between the first and second electrodes;
   a core component extending between the first and second electrodes in contact with respective inner surfaces of said opposed layers; and
   an outer component extending between the electrodes in contact with respective outer surfaces of said opposed layers,
   wherein at least one of the core component and the outer component is formed of an electrically-conductive material and is arranged to present, to a cell current produced by the read voltage, a lower-resistance current path than an amorphous phase of said phase-change material in any of said programmed cell states, said lower-resistance current path having a length dependent on size of the amorphous phase in said opposed layers.

2. A memory cell according to claim 1, wherein a resistance presented to said cell current by each of the core component and the outer component is greater than that of the crystalline phase of said phase-change material in any of said cell states.

3. A memory cell according to claim 1, wherein said opposed layers are substantially parallel.

4. A memory cell according to claim 1, wherein said opposed layers have a thickness in the range of about 1 to 20 nm.

5. A memory cell according to claim 1, wherein said opposed layers join to form an annulus around the core component.

6. A memory cell according to claim 5, wherein said annulus has a substantially circular cross-section.

7. A memory cell according to claim 1, wherein the core component comprises a nanowire.

8. A memory cell according to claim 1, wherein at least one of the core component and the outer component formed of electrically-conductive material extends substantially from one electrode to the other.

9. A memory cell according to claim 1, wherein the phase-change component includes a base layer joining said opposed layers and located between one electrode and an end of the core component.

10. A memory cell according to claim 3, wherein each of the core component and the outer component is formed of electrically-conductive material.

11. A memory cell according to claim 1, wherein the outer component is formed of electrically-insulating material.

12. A memory cell according to claim 1, wherein the core component is formed of electrically-insulating material.

13. A memory cell according to claim 1, wherein the memory cell stores information in $s>2$ programmable cell states.

14. A memory cell according to claim 13, wherein the resistance per unit length of the or each said component formed of electrically-conductive material varies in the direction of said current path, thereby to provide a desired cell operating characteristic.

15. A memory cell according to claim 14, wherein a resistance per unit length increases in a direction in which the length of the current path increases with the size of said amorphous phase.

16. A memory cell as according to claim 14, wherein the at least one of the core component and the outer component formed of electrically-conductive material comprises alternating first and second sections in the direction of said current path, the first sections being of lower resistance than the second sections to provide a stepped programming curve for the memory cell.

17. A memory cell according to claim 1, wherein an arrangement is such that said amorphous phase expands from a middle region of each of the opposed layers towards both electrodes in successive said cell states.

18. A memory cell according to claim 1, wherein an arrangement is such that said amorphous phase expands in the opposed layers from one electrode towards the other in successive said cell states.

19. A memory device comprising:
 an array of phase-change memory cells as claimed in claim 1; and
 a read/write controller for reading and writing data in the memory cells.

20. A method for forming a phase-change memory cell for storing information in a plurality of programmable cell states, the method comprising:
 forming an outer component having opposed surfaces defining a trench;
 forming a phase-change component in the trench, the phase-change component comprising opposed layers of phase-change material in contact with respective opposed surfaces of the outer component;
 forming a core component in contact with respective inner surfaces of said opposed layers; and
 forming first and second electrodes for applying a read voltage to the phase-change component to read the programmed cell state in use;
 wherein the method is performed such that each of said outer component, said opposed layers of phase-change material and said core component extend in a direction between the electrodes, and at least one of the core component and the outer component is formed of electrically-conductive material and is arranged to present, to a cell current produced by the read voltage, a lower-resistance current path than the amorphous phase of said phase-change material in any of said cell states, said current path having a length dependent on size of the amorphous phase in said opposed layers.

21. A method according to claim 20, further comprising:
 forming said outer component such that said opposed surfaces join to define a cavity;
 forming the phase-change component such that said opposed layers of phase-change material join to form an annulus in the cavity.

22. A method for forming a phase-change memory cell for storing information in a plurality of programmable cell states, the method comprising:
 forming a core component;
 forming a phase-change component on the core component, the phase-change component including opposed layers of phase-change material in contact with respective outer surfaces of the core component;
 forming an outer component in contact with respective outer surfaces of said opposed layers; and
 forming first and second electrodes for applying a read voltage to the phase-change component to read the programmed cell state in use;
 wherein the method is performed such that each of said outer component, said opposed layers of phase-change material and said core component extend between the first and second electrodes, and at least one of the core component and the outer component is formed of electrically-conductive material and is arranged to present, to a cell current produced by the read voltage, a lower-resistance current path than an amorphous phase of said phase-change material in any of said cell states, said current path having a length dependent on size of the amorphous phase in said opposed layers.

23. A method according to claim 22, wherein the method is performed such that the opposed layers of phase-change material join to form an annulus around the core component.

24. A method according to claim 23, wherein the core component comprises a nanowire.

* * * * *